(12) United States Patent
Nandi (10) Patent No.: US 7,436,724 B2
(45) Date of Patent: Oct. 14, 2008

(54) METHOD AND SYSTEM FOR INDEPENDENT CONTROL OF VOLTAGE AND ITS TEMPERATURE CO-EFFICIENT IN NON-VOLATILE MEMORY DEVICES

(75) Inventor: Prajit Nandi, Karnataka (IN)

(73) Assignee: SanDisk Corporation, Milpitas, CA (US)

( * ) Notice: Subject to any disclaimer, the term of this patent is extended or adjusted under 35 U.S.C. 154(b) by 242 days.

(21) Appl. No.: 11/499,067

(22) Filed: Aug. 4, 2006

(65) Prior Publication Data
US 2008/0031066 A1 Feb. 7, 2008

(51) Int. Cl.
*G11C 7/04* (2006.01)
(52) U.S. Cl. .................................. 365/211; 365/185.22
(58) Field of Classification Search .................. 365/211, 365/185.22, 185.17
See application file for complete search history.

(56) References Cited

U.S. PATENT DOCUMENTS

| | | | |
|---|---|---|---|
| 5,864,504 A | 1/1999 | Tanzawa et al. | |
| 6,026,023 A | 2/2000 | Tonda | |
| 6,205,074 B1 * | 3/2001 | Van Buskirk et al. | ....... 365/211 |
| 6,452,437 B1 | 9/2002 | Takeuchi et al. | |
| 6,560,152 B1 | 5/2003 | Cernea | |
| 6,667,904 B2 | 12/2003 | Takeuchi et al. | |
| 6,801,454 B2 | 10/2004 | Wang et al. | |
| 6,807,111 B2 | 10/2004 | Marotta et al. | |
| 6,870,766 B2 | 3/2005 | Cho et al. | |
| 7,057,958 B2 | 6/2006 | So et al. | |
| 7,180,211 B2 | 2/2007 | Sinha et al. | |
| 7,184,313 B2 * | 2/2007 | Betser et al. | ........... 365/185.24 |
| 7,266,031 B2 | 9/2007 | Kim et al. | |
| 7,313,044 B2 | 12/2007 | Fuhrmann et al. | |
| 7,342,831 B2 * | 3/2008 | Mokhlesi et al. | ....... 365/185.22 |
| 2007/0291566 A1 * | 12/2007 | Mokhlesi et al. | ............ 365/212 |
| 2007/0291567 A1 | 12/2007 | Mokhlesi et al. | |

OTHER PUBLICATIONS

Office Action mailed May 14, 2008, Application No. 11/618,541 filed Dec. 29, 2006.
Response to Office Action dated Aug. 11, 2008 in U.S. Appl. No. 11/618,541.

* cited by examiner

*Primary Examiner*—Anh Phung
(74) *Attorney, Agent, or Firm*—Vierra Magen Marcus & DeNiro LLP (57) ABSTRACT

Method and system for controlling voltage and its temperature co-efficient in a non-volatile memory device having a plurality of programmable memory cells is provided. The system includes a temperature-dependent voltage generator for generating an output that is controlled independently by a first multiplier; a temperature-independent voltage generator having a constant output, wherein the constant output is controlled by a second multiplier; and an amplifier that receives the constant output of the temperature-independent voltage generator and the output of temperature-dependent voltage generator to generate a voltage that is applied to a memory cell for a read, and program-verify operation; wherein the temperature co-efficient and voltage applied to memory cells is controlled independently so that intrinsic temperature coefficient of the memory cell is substantially similar to temperature coefficient of the applied voltage.

15 Claims, 9 Drawing Sheets

METHOD AND SYSTEM FOR INDEPENDENT CONTROL OF VOLTAGE AND ITS TEMPERATURE CO-EFFICIENT IN NON-VOLATILE MEMORY DEVICES

CROSS-REFERENCE TO RELATED APPLICATIONS

None

BACKGROUND

1. Field of the Invention

The present invention relates generally to non-volatile memory devices ("flash memory devices") and, more particularly, to independently controlling a read voltage (or a program-verify voltage) and temperature co-efficient associated with the voltage

2. Background of the Invention

Semiconductor memory devices have become popular for use in various electronic devices. For example, non-volatile semiconductor memory is used in cellular telephones, digital cameras, personal digital assistants, mobile computing devices, non-mobile computing devices and other electronic devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. A NAND array has a number of memory cells (or storage units, used interchangeably throughout this specification), such as 4, 8, 16, or even 32, connected in series string (NAND string) between a bit line and a reference potential through select transistors at either end. Word lines are connected with control gates of cells in different series strings. Relevant examples of NAND arrays and their operation are given in the following U.S. patents that are incorporated herein in their entirety by this reference: U.S. Pat. Nos. 5,570,315, 5,774,397 and 6,046,935.

Individual memory cells of such flash memory devices typically include one or more storage elements that store a variable amount of static charge. The storage elements are most commonly conductive floating gates, so this is the example primarily described herein, but can also be areas of a charge trapping dielectric. The level of charge stored by the floating gate represents the data value stored by the data storage element. The floating gate typically overlies a channel region of a transistor.

Data is read from a storage location by applying a voltage to a control gate overlying the floating gate. The level of charge stored by the floating gate, in combination with the voltage applied to the control gate, determines whether the transistor will conduct current through its channel. The level of charge stored by the floating gate can therefore be determined by either measuring that current or finding the control gate voltage required to make the transistor conduct. In either case, the measured quantity is compared with reference levels in order to determine the state of the cells.

Binary state memory cells may be used in flash memories. These memory cells have two states: "programmed" (usually representing a one) and "erased" (usually representing a zero). However, such cells do not efficiently use the valuable real estate of the integrated circuit, since only one bit of information is stored per floating gate. Many flash memories therefore use multiple charge levels (more than two) for the floating gates, so that each floating gate may store more than one bit of information.

As the number of charge level states of the operation of individual floating gates increases, the voltage difference between the states necessarily decreases. The increasing proximity of the voltage level ranges for an increased number of states makes discerning one state from another difficult.

Since the operating characteristics of the memory cell transistors change with temperature, the control gate voltage required to turn on the transistor also should vary with temperature, even as the charge level carried by the floating gate remains unchanged. Any mismatch in the thermal variation of the control gate voltage and the thermal variation of the operating characteristics of the memory cell transistors can result in inaccurate reading of data from memory cells, due to the close proximity of the voltage levels of the floating gate.

During a read or program-verify operation of a multilevel memory cell (MLC) a plurality of predetermined voltages are applied from a voltage generator to the control gate of the selected memory cell. A resulting threshold voltage Vt varies with temperature, which is denoted by a temperature coefficient. Temperature coefficient is a temperature dependent multiplication factor. In flash memories the threshold voltage temperature co-efficient ($T_{CO}$) has a typical value of approximately $-1.7$ mV/° C. The intrinsic $T_{CO}$ value of a memory cell can vary from $-1.2$ mV/° C. to $-2.2$ mV/° C.

Data is stored in a memory cell at one temperature and may be read at another temperature. The read voltage applied to a memory cell gate should be greater than the threshold voltage of the memory cell and this difference should remain substantially constant over a temperature. Thus, it is desirable that the $T_{CO}$ for various voltages applied to the memory cell be substantially similar to the intrinsic $T_{CO}$ of the memory cell.

Conventional systems fail to independently control the voltage level and the $T_{CO}$. This has disadvantages because the $T_{CO}$ of the memory cell may not match the $T_{CO}$ of the applied voltage. Conventional systems fail to adjust the $T_{CO}$ to compensate for variations in the memory cells intrinsic $T_{CO}$ and/or compensate for variations in the circuits that generate the $T_{CO}$.

Conventional systems fail to efficiently trim $T_{CO}$ values during flash memory testing.

Therefore, there is a need for a system and method to efficiently/independently control the applied voltage level and $T_{CO}$ and efficiently trim $T_{CO}$ values during flash memory testing.

SUMMARY OF THE INVENTION

In one aspect of the present invention, a system for controlling voltage and its temperature co-efficient in a non-volatile memory device having a plurality of programmable memory cells is provided. The system includes a temperature-dependent voltage generator for generating an output that is controlled independently by a first multiplier; a temperature-independent voltage generator having a constant output, wherein the constant output is controlled by a second multiplier; and an amplifier that receives the constant output of the temperature-independent voltage generator and the output of temperature-dependent voltage generator to generate a voltage that is applied to a memory cell for a read, and program-verify operation; wherein the temperature co-efficient and voltage applied to memory cells is controlled independently so that intrinsic temperature coefficient of the memory cell is substantially similar to temperature coefficient of the applied voltage.

In another aspect of the present invention, a testing system for trimming temperature coefficient ($T_{CO}$) of a plurality of read voltages and program-verify voltages applied to a plurality of non-volatile programmable memory cells of a non-volatile memory device is provided. The testing system includes a testing module that provides a first multiplier value for a temperature dependant voltage and a second multiplier value for a temperature independent voltage, wherein multiplied temperature dependant voltage and temperature independent voltage are added and an output voltage is generated; and a voltage comparator that compares the output voltage with a test voltage that is set by the testing module and generates a compare result for the testing module.

A method for trimming temperature co-efficient ($T_{CO}$) of a plurality of read and program-verify voltages applied to a plurality programmable memory cells of a non-volatile memory device is provided. The method includes applying predetermined voltage levels to an input of a voltage comparator that compares a temperature independent voltage component with a voltage set by a testing system; and compares a temperature dependent voltage component with a voltage set by the testing system; adjusting a second voltage multiplier of the temperature-independent voltage component of a voltage that is applied to a memory cell of a non-volatile memory device until a desirable output condition is achieved; adjusting a first voltage multiplier of the temperature-dependent component of a voltage that is applied to a memory cell of a non-volatile memory device until a desirable output condition is achieved; and storing adjusted first voltage multiplier values and adjusted second multiplier values in the memory device for use by a controller.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. The illustrated embodiment is intended to illustrate, but not to limit the invention. The drawings include the following.

DETAILED DESCRIPTION OF THE PREFERRED EMBODIMENT

Definitions:

The following definitions are provided as they are typically (but not exclusively) used in relation to NAND-flash memory devices, referred to by various aspects of the present invention.

"Temperature coefficient" or "$T_{CO}$" is a multiplication factor operating on a temperature-dependent variable. In case of positive $T_{CO}$, the variable will increase, and in case of negative $T_{CO}$, the variable will decrease with temperature.

"$V_{CGRV}$" stands for Gate Control Read Verify Voltage; a voltage applied to the gate of the non-volatile memory cell in excess of the threshold voltage of that cell to facilitate the reading state of the cell.

"VCGRV" is used in this document as the name of a voltage generator generating $V_{CGRV}$.

In one aspect of the present invention, a system for independent control of Gate Control Read Verify voltage level and its associated $T_{CO}$ is provided. The system includes: a temperature-independent voltage generator having constant output, wherein its voltage level is controlled independently by a multiplier; a temperature-dependent voltage generator having its output controlled independently by another multiplier in a manner which allows it to match a memory cell's threshold voltage temperature coefficient; and a "difference amplifier" combining the outputs of the voltage generators to produce a gate control voltage.

In another aspect of the present invention, a testing system for trimming temperature co-efficient at a constant temperature is provided. The testing system includes a tester; a voltage comparator; and a non-volatile memory device having a gate control voltage generator with independently controlled voltage and temperature coefficient. The tester controls the gate control voltage generator and provides one of the inputs to the comparator, while the gate control voltage generator provides the other input to the comparator.

In another aspect of the present invention, a method for trimming temperature co-efficient, at constant temperature, of Gate Control Read Verify voltage used in a non-volatile memory device is provided. The term trimming as used herein means setting and storing a particular parameter in a non-volatile memory device by a tester used by the memory device for normal operations. The method includes applying predetermined voltage levels to an input of a comparator; setting a voltage multiplier of a temperature-dependent component of $V_{CGRV}$ to 0, then adjusting a voltage multiplier of a temperature independent component until a desired output level is reached; adjusting the voltage multiplier of the temperature-dependent component of $V_{CGRV}$ until a desired trimming of $T_{co}$ and the voltage level of the output $V_{CGRV}$ is achieved; and then the multiplier values are stored for normal operation.

To facilitate an understanding of the preferred embodiment, the general architecture and operation of a non-volatile memory system will first be described. The specific architecture and operation of the preferred embodiment will then be described with reference to the general architecture.

Example Non-Volatile Memory System

Figure 1A:
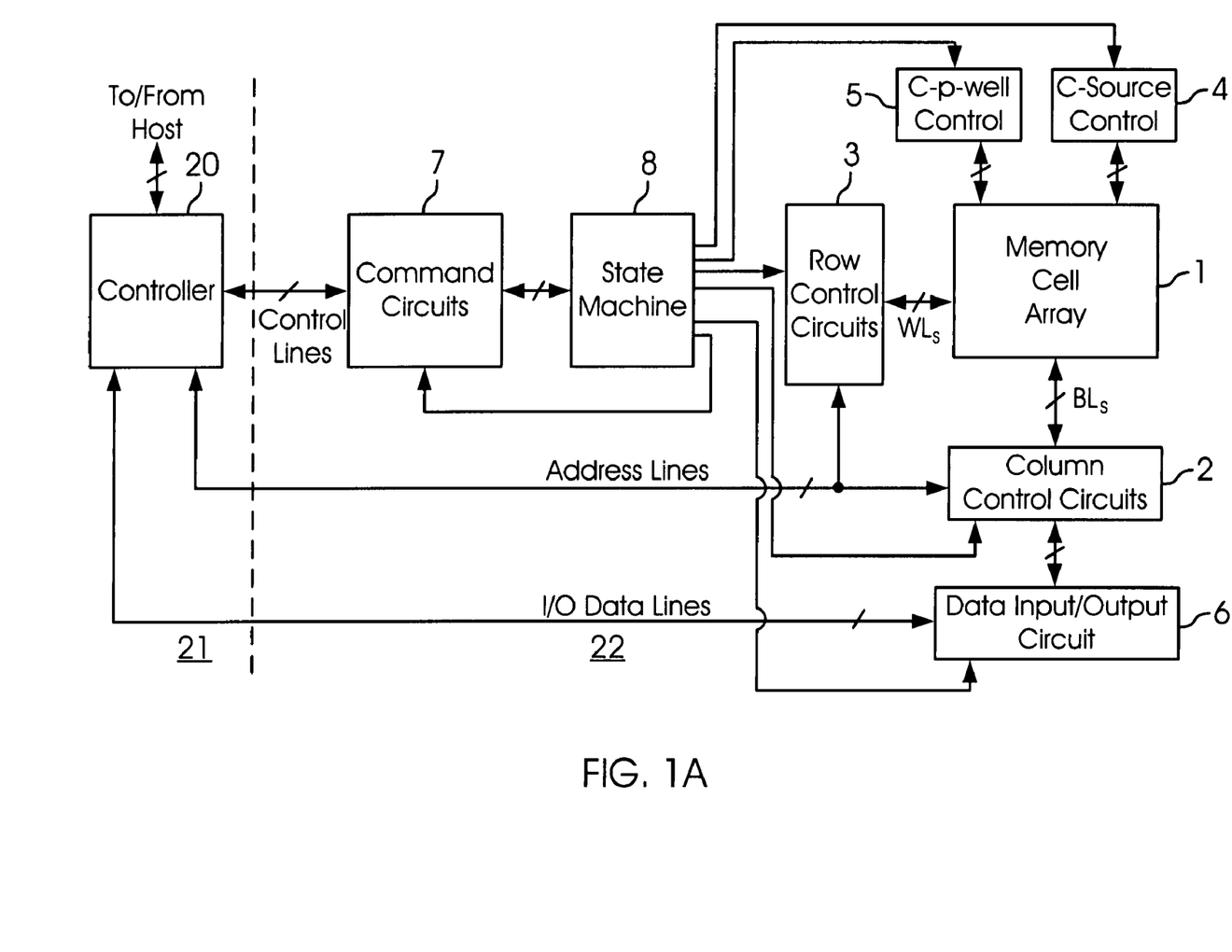
FIG. 1A is a top view of a NAND string.

With reference to FIGS. 1A-1D, a specific non-volatile memory system is described in which the various aspects of the present invention are implemented, in order to provide specific examples. FIG. 1A is a block diagram of a flash memory system. Memory cell array 1 including a plurality of memory cells M arranged in a matrix is controlled by a column control circuit 2, a row control circuit 3, a c-source control circuit 4 and a c-p-well control circuit 5.

Column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. Row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region (labeled as "c-p-well" 11 in FIG. 1C) on which the memory cells (M) are formed. The c-source control circuit 4 controls a common source line (labeled as "c-source" in FIG. 1B) connected to the memory cells (M). The c-p-well control circuit 5 controls the c-p-well voltage.

Data stored in the memory cells (M) are read out by column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with controller 20. The command data informs the flash memory of what operation is requested. The input command is transferred to a state machine 8 that controls column control circuit 2, row control circuit 3, the c-source control circuit 4, the c-p-well control circuit 5 and the data input/output buffer 6. State machine 8 can output a status data of the flash memory such as READY/BUSY or PASS/FAIL.

Controller 20 is connected or connectable with a host system such as a personal computer, a digital camera, or a personal digital assistant. It is the host that initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array.

A typical memory system includes one integrated circuit chip 21 that includes controller 20, and one or more integrated circuit chips 22 that each contains a memory array and associated control, input/output and state machine circuits. The trend, of course, is to integrate the memory array and controller circuits of a system together on one or more integrated circuit chips.

The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 1B:
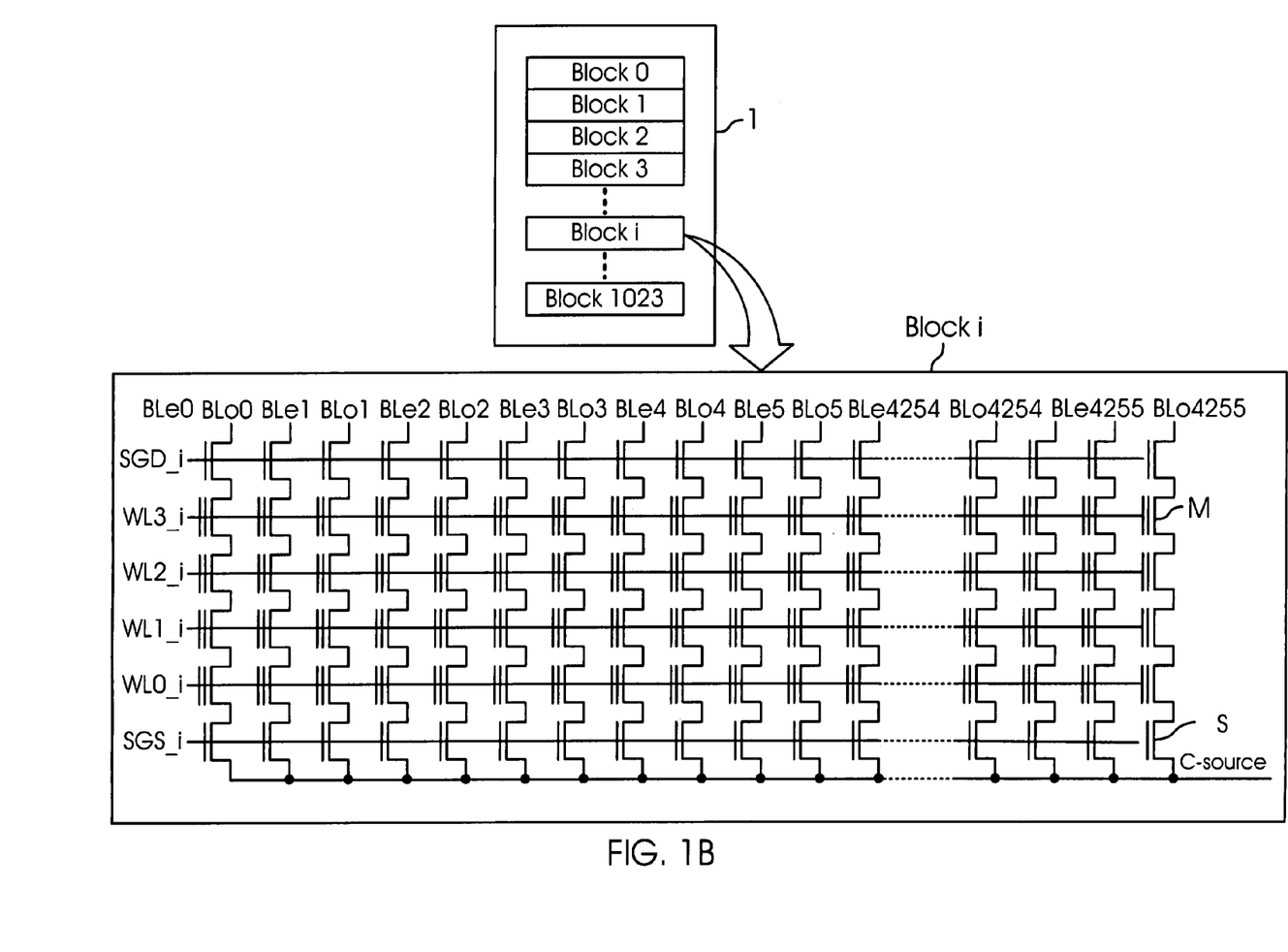
FIG. 1B is an equivalent circuit diagram of the NAND string.

With reference to FIG. 1B, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo).

Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously. This 532 B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

Figure 1C:
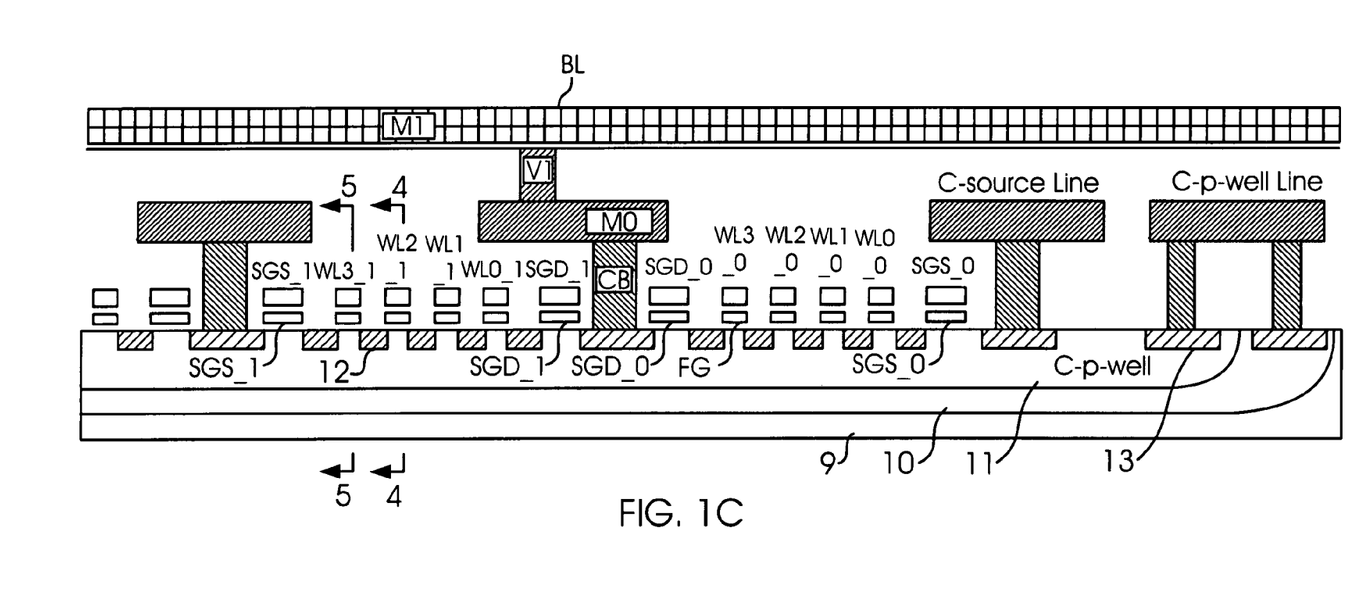
FIG. 1C is a cross sectional view of the NAND string of FIG. 1A.

FIG. 1C shows a cross sectional view of a NAND cell unit of the type shown schematically in FIG. 1B, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1A).

Each memory cell has a floating gate (FG) that stores an amount of electric charge corresponding to the data being stored in the cell, the word line (WL) forming the gate electrode, and drain and source electrodes made of the n-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

In the read and verify operations, the select gates (SGD and SGS) and the unselected word lines (WL0, WL1 and WL3) are raised to a read pass voltage of 4.5V to make these as pass gates. The selected word line (WL2) is connected to a voltage, a level of which is specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY01 operation, the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M).

Figure 1D:
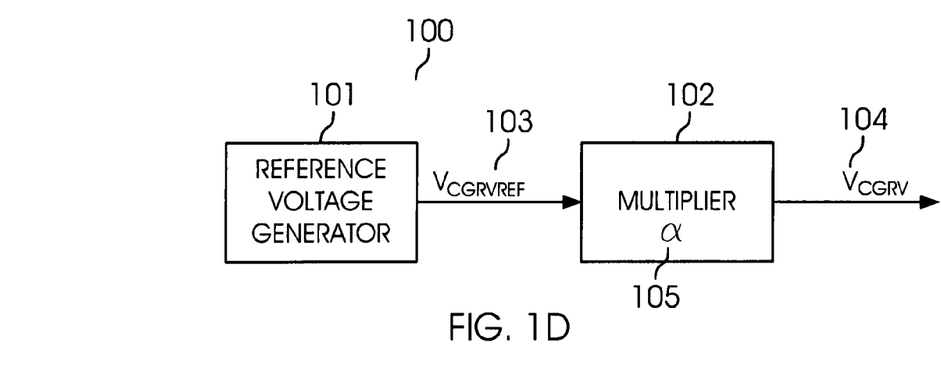
FIG. 1D is a block diagram illustrating a conventional architecture of a gate control voltage generator.

FIG. 1D shows a typical system for generating/controlling read (or program-verify voltage). Reference voltage generator 101 generates a reference voltage ($V_{CGRVREF}$ 103) that is multiplied by multiplier 102 by multiplication factor α (105). The read/program-verify voltage is shown as $V_{CGRV}$ 104, which is applied to a control gate of a memory cell that is being read at any given instance. $V_{CGRV}$ 104 can be expressed as Equation (1):

$$V_{CGRV} = \alpha * V_{CGRVREF} \quad \text{Equation(1)}$$

where $V_{CGRV}$ 104 is the control gate voltage, α 105 is a multiplication factor and $V_{CGRVREF}$ 103 is a reference voltage level $T_{CO}$ of $V_{CGRV}$ can be obtained as shown in Equation (2) below:

$$T_{CO} = \frac{\partial V_{CGRV}}{\partial T} = \alpha * \frac{\partial V_{CGRVREF}}{\partial T} \quad \text{Equation (2)}$$

Where δT is the incremental temperature change

As discussed above, conventional systems fail to independently control $T_{CO}$ and the voltage level of $V_{CGRV}$.

Independent Voltage/Temperature Control System

Figure 2:
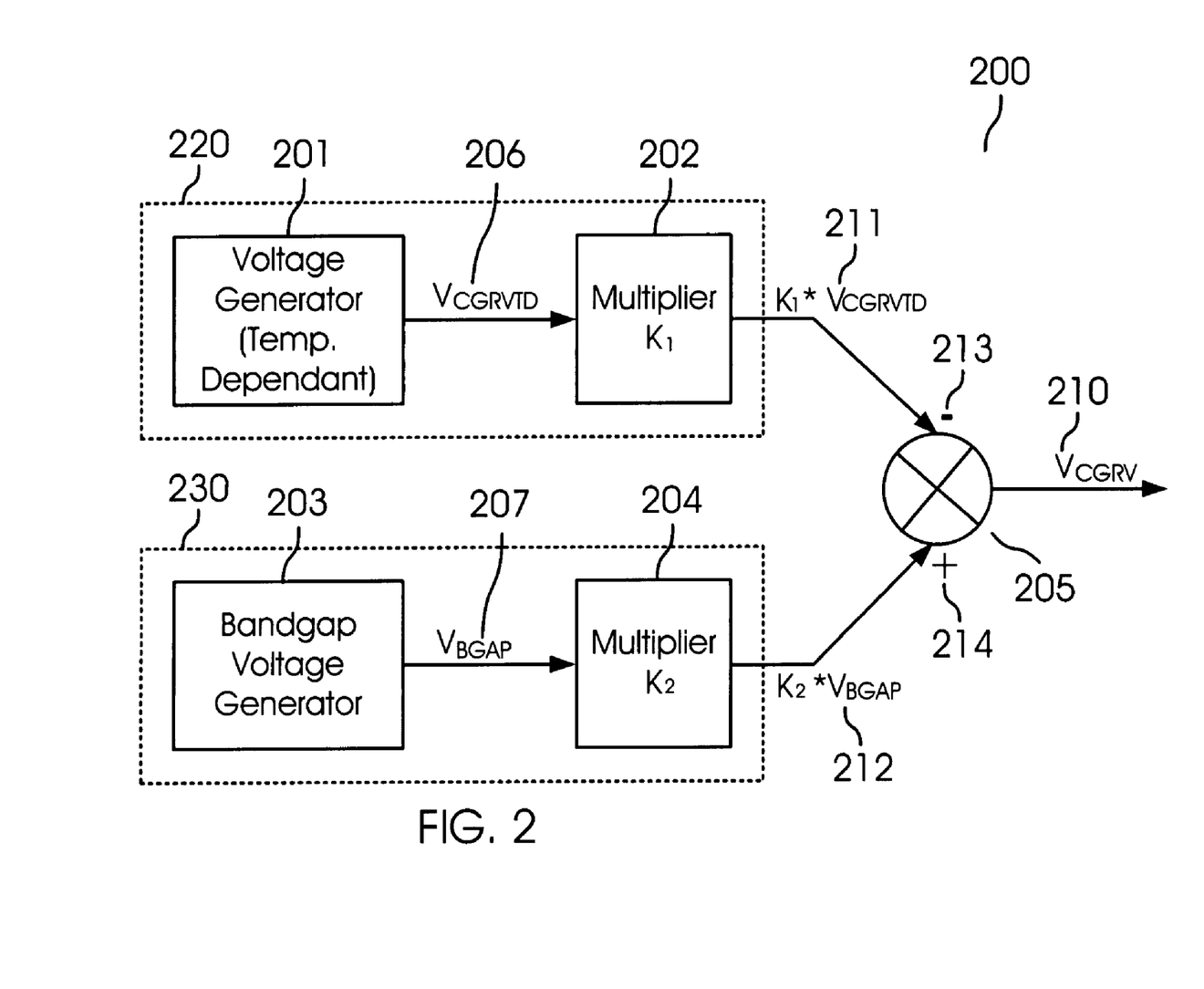
FIG. 2 is a block diagram showing a system for independent control of voltage and $T_{CO}$, according to one aspect of the present invention.

FIG. 2 shows a system 200 for independent control of voltage level and the $T_{CO}$ of $V_{CGRV}$, according to one aspect of the present invention. System 200 includes modules 220 and 230 and a "difference amplifier" 205. Output 211 from module 220 (shown as 211) depends on temperature, while output 212 from module 230 is independent of temperature.

Module 220 includes a voltage generator 201 that generates a reference voltage 206, which is temperature dependant. Reference voltage 206 is multiplied by a multiplication factor K1. The output of multiplier 202 is shown as 211 and is connected to input 213.

Module 230 includes a band-gap voltage generator 203 that generates a band-gap reference voltage ($V_{BGAP}$) 207, which is temperature independent. Reference voltage 207 is sent to multiplier 204 that multiplies the reference voltage by a factor $K_2$. Multiplier 204 has an output 212 which is connected to input 214.

Difference amplifier 205 outputs $V_{CGRV}$ 210 with independently controlled voltage level and $T_{CO}$.

$V_{CGRV}$ 210 can be expressed by Equation (3) below:

$$V_{CGRV} = K_2 * V_{BGAP} - K_1 * V_{CGRVTD} \quad \text{Equation (3)}$$

where, $K_1$ is the voltage multiplier for voltage generator 201, $K_2$ is an adjustment factor for voltage generator 203, $V_{BGAP}$ 207 is a temperature independent band-gap reference voltage, $V_{CGRVTD}$ 206 is a temperature dependent voltage, as described above.

Based on equation (3), $T_{CO}$ of $V_{CGRV}$ is calculated as shown below in Equation (4):

$$T_{CO} = \frac{\delta V_{CGRV}}{\delta T} = K_2 \frac{\delta V_{BGAP}}{\delta T} - K_1 \frac{\delta V_{CGRVTD}}{\delta T} \quad \text{Equation (4)}$$

$$T_{CO} = \frac{\delta V_{CGRV}}{\delta T} = 0 - K_1 \frac{\delta V_{CGRVTD}}{\delta T}$$

$$\frac{\delta V_{BGAP}}{\delta T} = 0$$

Because $V_{BGAP}$ is independent of temperature where T is the absolute temperature Equation (3) and Equation (4) show that the present invention provides independent control of read/verify voltage level and $T_{CO}$ of $V_{GCRV}$ 210.

Figure 3A:
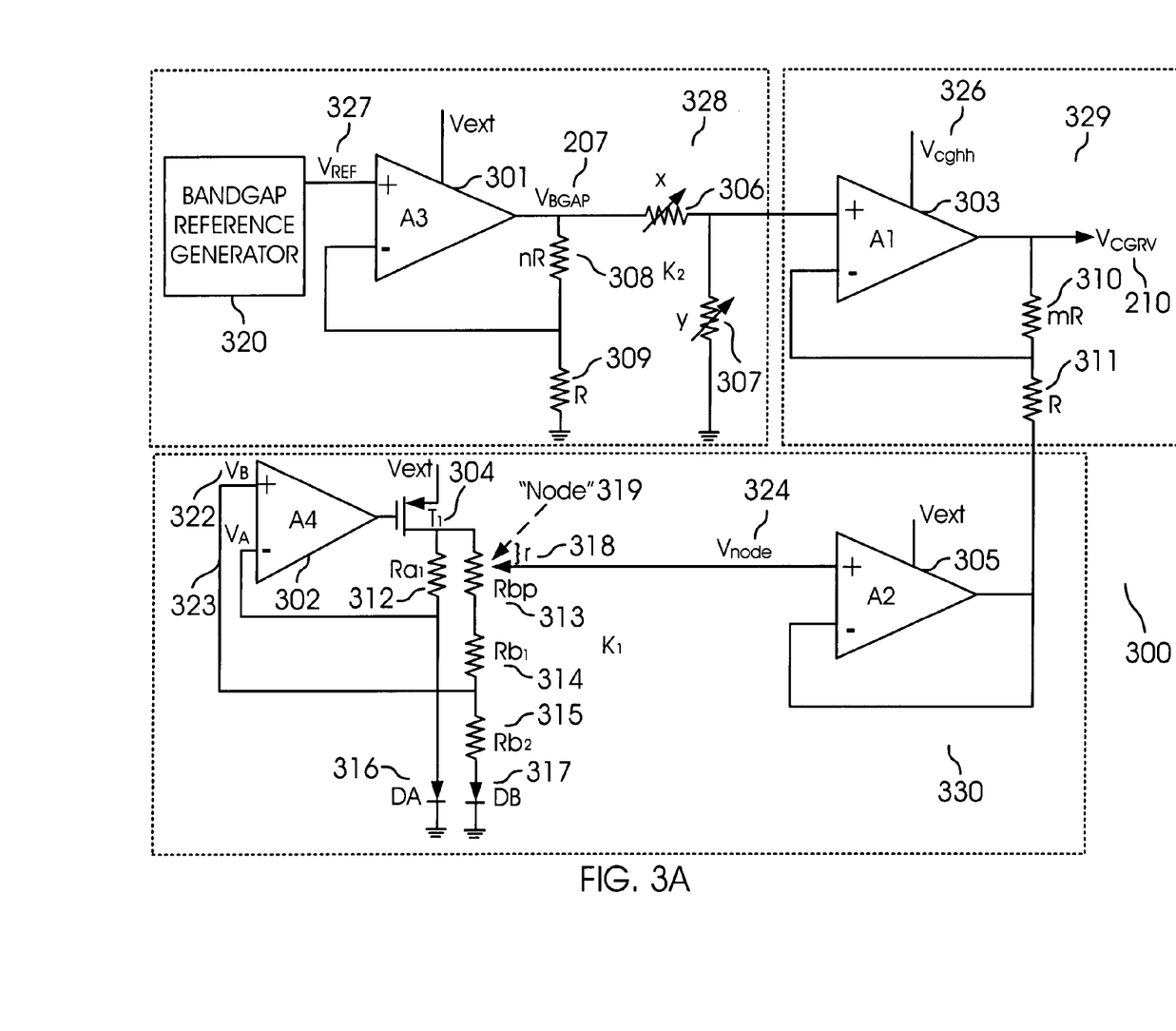
FIG. 3A is a schematic diagram illustrating a circuit for independent control of voltage and $T_{CO}$, according to one aspect of the present invention.

FIG. 3A shows a circuit 300 for implementing system 200 for independent control of voltage level and $T_{CO}$ of $V_{CGRV}$ 210. Temperature independent component of $V_{CGRV}$ 210 is generated by circuit 328, which is similar to 230. Circuit 328 includes a band-gap generator 320 (similar to 203 and used interchangeably), a differential amplifier A3 301 and a voltage divider network $K_2$ made of resistor x 306 and resistor y 307. Band-gap generator 320 is connected to the non-inverting input of differential amplifier A3 301, while a feedback network from resistors nR (308) and R (309) is connected to the inverting input of differential amplifier A3 301.

The temperature independent component of $V_{CGRV}$ ($K_2 * V_{BGAP}$) can be determined by Equation (5):

$$K_2 * V_{BGAP} = V_{REF} \left\{ (1 + n) * (1 + m) * \left( \frac{y}{x+y} \right) - m \right\} \quad \text{Equation (5)}$$

where $V_{REF}$ is the band reference voltage 327, n is the ratio of resistors 308 and 309, m is the ratio of resistors 310 and 311, x and y are the values of resistors 306 and 307 respectively.

$T_{CO}$ of $K_2 * V_{BGAP}$ is expressed by Equation (6):

$$T_{CO} = \frac{\delta(K_2 * V_{BGAP})}{\delta T} \quad \text{Equation (6)}$$

Tco=0 (because $V_{REF}$ and resistor ratios n, m, and $$\left( \frac{y}{x+y} \right)$$

resistor ratios are independent of temperature).

Temperature-dependent component of $V_{CGRV}$ 210 is generated by circuit 330 (i.e. implementing module 220). Circuit 330 includes a voltage generator with adjustable output level and a voltage follower 305. The voltage generator comprises of an operational amplifier A4 302, transistor T1 304, diodes: DA 316 and DB 317, and resistors: $Ra_1$ 312, Rbp 313, $Rb_1$ 314, and $Rb_2$. 315. The operational amplifier's input voltages $V_A$ 323 and $V_B$ 322 are regulated so that they are substantially the same value. The input voltage of the operational amplifier depends on the forward voltage of a diode in a respective current branch coupled to the output of the operational amplifier via transistor T1.

One current branch is formed by serially connecting $R_{a1}$ 312 and DA 316, while the other branch is formed by serially connecting Rbp 313, $R_{b1}$ 314, Rb2 315, and DB 317. The forward voltage of a diode normally has a temperature coefficient of −2 mV/° C. at 0.6 Volt.

When Ra1=Rb1+Rbp, the generated output is available from a "Node" 319. This node can be placed anywhere in the resistor chain formed by resistors Rbp 313, Rb1 314 and Rb2 315. Voltage 324 (Vnode) can be determined by using Equation (7):

$$V_{node} = Vref + \frac{(R_{bp} - r) * k * T * \ln A}{R_{b2} * q} \qquad \text{Equation (7)}$$

where k is the Boltzmann constant=1.380 6505(24)×10$^{-23}$ joules/Kelvin;

q is unit charge=1.60217646 10$^{-19}$ Coulombs; A is the ratio of the area of diodes DB/DA; r 318 is the resistance value resistor chain formed by resistors Rbp 313, Rb1 314 and Rb2 315 and measured between the "Node" 319 and the drain of transistor T1 304.

The temperature dependent component of $V_{CGRV}$ ($K_1 * V_{CGRVTD}$) can be determined by Equation (8):

$$K1 * V_{CGRVTD} = \frac{(R_{bp} - r) * k * m * T * \ln A}{R_{b2} * q} \qquad \text{Equation (8)}$$

Difference amplifier 329 combines the temperature-dependent and the temperature-independent components of $V_{CGRV}$ 210. The difference amplifier 329 includes an amplifier 303, and resistor mR 310 forming a negative feedback to amplifier 303. The non-inverting input of amplifier 303 receives the temperature-independent component of $V_{CGRV}$, while the temperature-dependent component of $V_{CGRV}$ is coupled to amplifier 303 inverting input via resistor R 311. Difference amplifier 329 outputs $V_{CGRV}$ 210 with independently controlled voltage and $T_{CO}$. Power to amplifier A1 303 is provided by $V_{cghh}$ 326 a boosted high voltage source.

The generated $V_{CGRV}$ 210 can be expressed as shown below in Equation (9):

$$V_{CGRV} = \qquad (9)$$
$$V_{REF}\left\{(1+n)*(1+m)*\left(\frac{y}{x+y}\right) - m\right\} - \frac{(Rbp - r)*m*k*T*\ln A}{Rb_2 * q}$$

While $T_{CO}$ of $V_{CGRV}$ is expressed by Equation (10):

$$T_{CO(VCGRV)} = -\frac{(R_{bp} - r) * m * k * \ln A}{R_{b2} * q} \qquad (10)$$

Figure 3B:
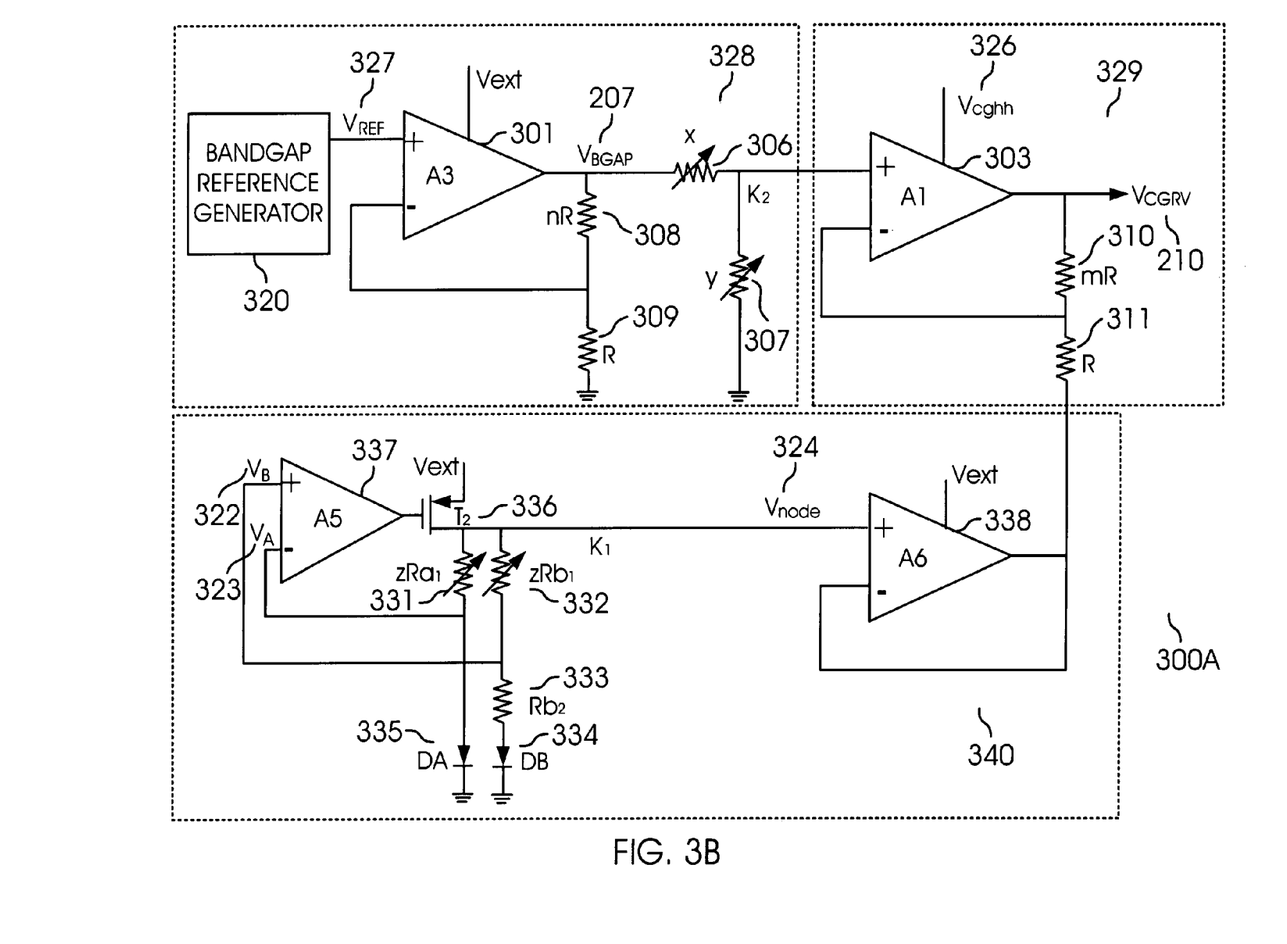
FIG. 3B is a schematic diagram illustrating an alternative circuit implementation of a system for independent control of voltage and its associated $T_{CO}$, according to one aspect of the present invention.

FIG. 3B shows an alternate circuit implementation (300A) of system 200 to independently control voltage level and $T_{CO}$ of $V_{CGRV}$ 210. This circuit largely follows the one depicted in FIG. 3A in terms of construction and function. The difference between the two implementations is in the temperature-dependent generator part of the circuit and specifically the way the output level is adjusted. In FIG. 3B, circuit 340 performs the function of circuit 330 (FIG. 3A).

Components 337, 336, 335 and 334 of FIG. 3B are similar to components 302, 304, 316 and 317 of FIG. 3A, respectively In Circuit 340, one current branch is formed by serially connecting resistor $zR_{a1}$ 331 and DA 335, while the other branch is formed by serially connecting resistors zRb1 332, Rb2 333 and diode DB 334. The generated output voltage $V_{node}$324 can be determined by Equation (11):

$$Vnode = VthA + \frac{zR_{a1} * kT * \ln A}{R_{b2} * q} \qquad \text{Equation (11)}$$

$T_{CO(Vnode)}$ is calculated by Equation (12):

$$T_{CO(Vnode)} = \frac{\delta Vnode}{\delta T} \qquad \text{Equation (12)}$$
$$\Rightarrow T_{CO(Vnode)} = \left[\frac{\delta V_{thA}}{\delta T} + \frac{zR_{a1} * k}{R_{b2} * q} * \ln A\right]$$
$$\Rightarrow T_{CO(Vnode)} = \left[-1.7\,\text{mV}/°\text{C.} + \frac{zR_{a1} * k}{R_{b2} * q} * \ln A\right]$$

where $V_{thA}$ is the threshold voltage of diode DA

Using this alternate implementation of system 200, $V_{CGRV}$ 210 is expressed is by Equation (13):

$$V_{CGRV} = \qquad (13)$$
$$V_{REF}\left\{(1+n)*(1+m)*\left(\frac{y}{x+y}\right) - m\left(VthA + \frac{zRa1 * kT * \ln A}{Rb_2 * q}\right)\right\}$$

While $T_{CO}$ of $V_{CGRV}$ is expressed by Equation (14):

$$T_{CO(VCGRV)} = -m\left(\frac{\delta V_{thA}}{\delta T} + \frac{zR_{a1} * k}{R_{b2} * q} * \ln A\right) \qquad (14)$$

Examination of equations (9), (10), (13), and (14) show that separate independent control of voltage level and $T_{CO}$ of $V_{CGRV}$ is achieved by both aspects of the present invention.

Figure 4:
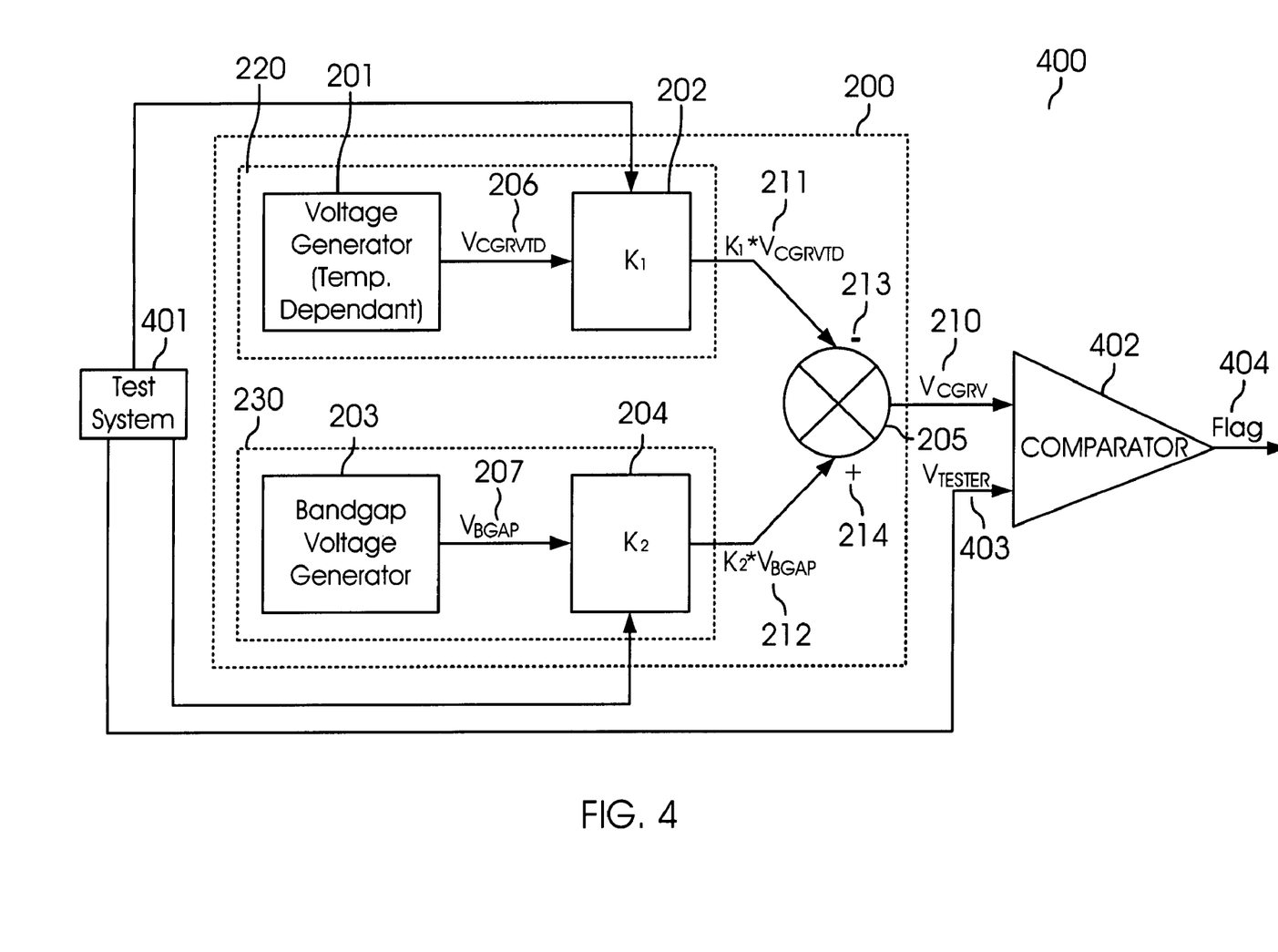
FIG. 4 is a block diagram showing a testing system used according to yet another aspect of the present invention.

Testing Memory Devices:

In another aspect of the present invention, a system and method for testing a memory device and trimming its $V_{CGRV}$ is provided. FIG. 4 shows a block diagram of a test system (or bench) 400 for testing and trimming the voltage $V_{CGRV}$ of a flash memory device with independently controlled voltage and $T_{CO}$. The purpose of this testing is to store optimum values for $K_1$ and $K_2$ so that the flash memory device can operate efficiently. A multi-state memory device has plural modes hence different values of $K_1$ and $K_2$ are stored within the flash memory device (memory cells or dedicated read only memory (not shown) that is available for controller 20 (FIG. 1).

Test bench 400 includes test system ("Tester") 401 and comparator 402. Tester 401 includes a processor, computing hardware, ASIC etc. that can control controller 20 (FIG. 1A) and analyze test results. Tester 401 controls $V_{CGRV}$ 210 by supplying externally generated values for $K_1$ and $K_2$. Tester 401 also provides an input (403) to comparator 402. $V_{CGRV}$ 210 is the other input to the comparator 402. This configuration allows adjustment of $V_{CGRV}$ 210 to match the intrinsic $T_{CO}$ of the flash memory device. It also provides for temperature characterization of the flash memory device without the using a temperature chamber.

Testing is typically performed at ambient temperature ($T_{testing}$) for example at 20° C. (293 K). The testing/trimming process starts by setting $K_1$ and $K_2$ to a predetermined value. During testing/trimming, first K2 is adjusted until the desired voltage level for $V_{CGRV}$ is reached. Then $K_1$ is adjusted to set $T_{CO}$ of $V_{CGRV}$ to a desired value. At the end of the trimming process the selected values of $K_1$ and $K_2$ are stored in a memory cell (1) of the flash memory device or a read only memory (not shown).

Comparator 402 compares $V_{CGRV}$ 210 with Vtester 403 and generates a Flag 400 that is sent to tester 401. The Flag value is used, as described below with respect to FIG. 6.

During normal operation of a flash memory device, $K_1$ and $K_2$ are set by an internal digital controller 20. Controller 20 obtains $K_1$ and $K_2$ by reading digital information from an internal non-volatile memory. The digital information in turn sets x, y and r (not shown) at predetermined values. During a testing/trimming process, tester 401 takes control of the internal digital controller. Tester 401 adjusts the $K_1$ and $K_2$ to obtain optimum performance of the memory device.

Figure 5:
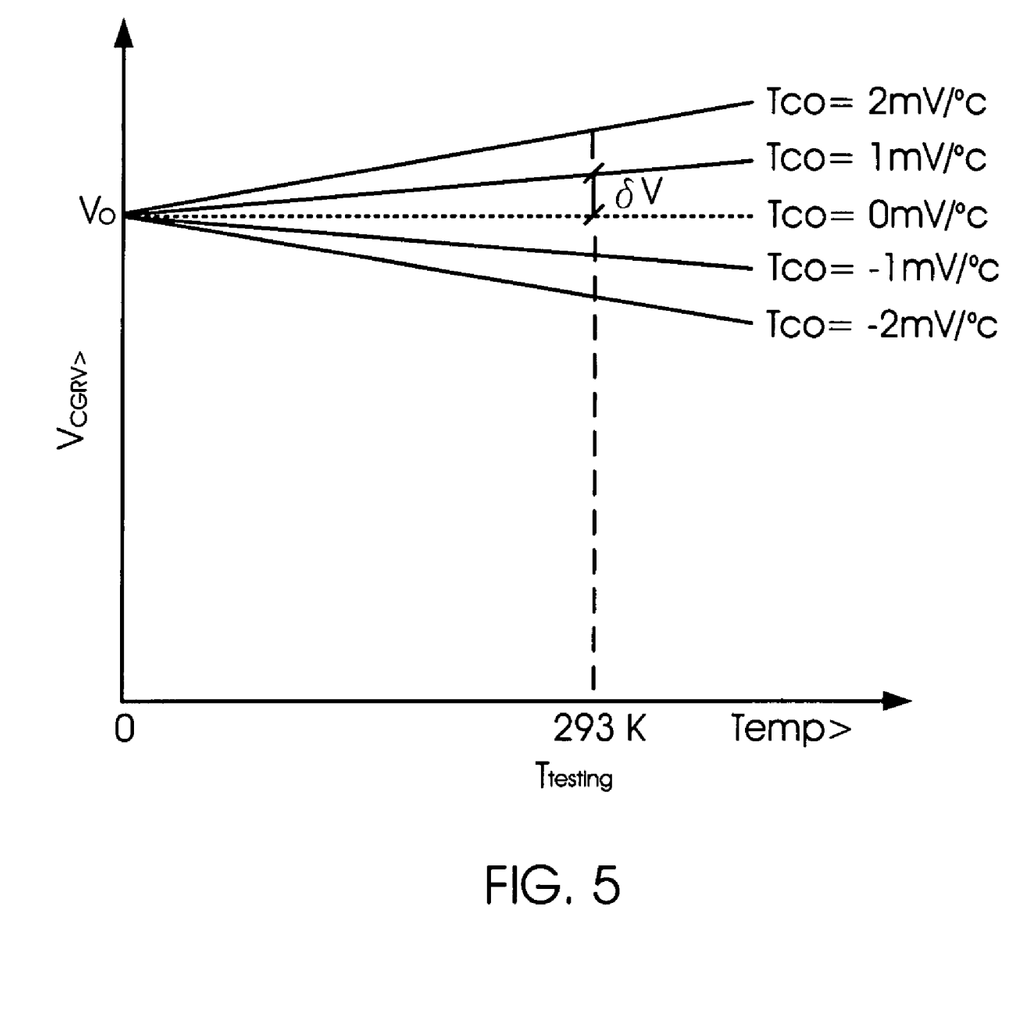
FIG. 5 is a diagram showing temperature dependency of gate control voltage with different $T_{CO}$.

FIG. 5 graphically illustrates the relationship between δV and change in $T_{CO}$. These values are used, as described below with respect to FIG. 6.

Figure 6:
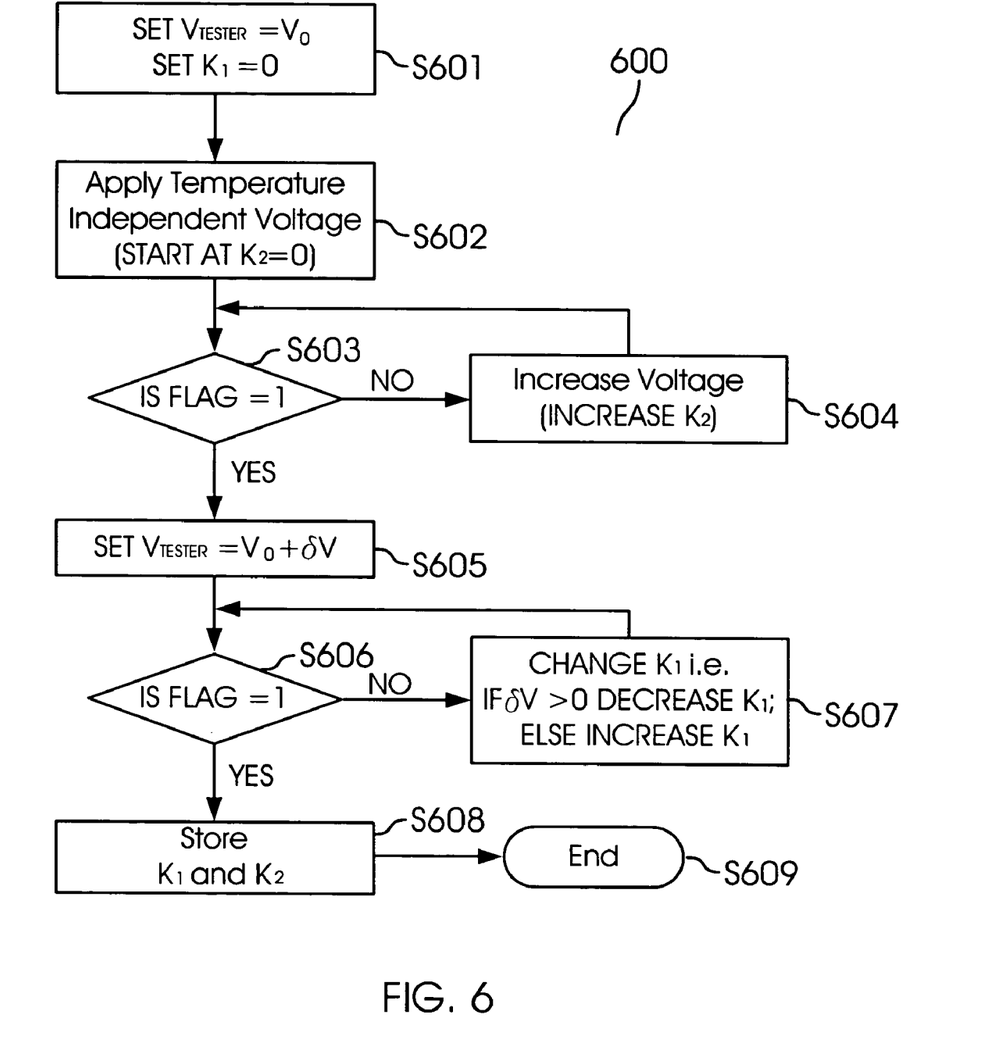
FIG. 6 shows a flow diagram for testing a flash memory device and trimming its $T_{CO}$, according to yet another aspect of the present invention.

FIG. 6 shows a process flow diagram 600 for testing a flash memory device and trimming its $V_{CGRV}$, according to one aspect of the present invention. It is noteworthy that trimming is performed at constant temperature, which is efficient and saves time.

Turning in detail to FIG. 6, testing/trimming starts in step S601. $V_{TESTER}$ 403 is set to some initial voltage value V0 (for example, 1.5 V) and K1 is set to value of 0. In step S602, temperature independent voltage (206) is applied; $K_2$ is set to a starting value of 0.

In step S603, the process determines if Flag 404 is set to 1. If not, then voltage is increased (i.e. $K_2$ is increased) in step S604 and the process loops back to step S603. If the Flag 404 is set to 1, then in step S605, the $V_{TESTER}$ value is changed to $V_0+\delta V$. $V_0$ is the required voltage level which is temperature independent. The value of δV will depend on what $T_{CO}$ is desired. The value of "δV" may be determined by Equation (16) using the graphs of FIG. 5 These graphs are drawn and the value of δV is calculated before the testing procedure begins. The value of δV is pre-set in the tester.

$$\delta V = T_{testing} * Tco293 * 1 \text{ mV}/° C. = 293 \text{ mV} \quad (16)$$

where δV is the voltage difference which produces 1 mV/° C. $T_{CO}$, $T_{testing}$ is the ambient temperature during the test.

In step S606, Tester 401 determines if Flag 404 is equal to 1. If not, then the value of $K_1$ is modified in step S607. $K_1$ is increased if δV is less than 0. This process continues until Flag 404 is equal to 1. Based on δV a desired $T_{CO}$ can be obtained by adjusting $K_1$ in steps S606 and S607.

Once the $T_{CO}$ of $V_{CGRV}$ is "trimmed", $K_1$ and $K_2$ values are hard coded in step S608. The process ends in step S609.

In one aspect of the present invention, separate independent control over temperature coefficient ($T_{CO}$) and voltage level of $V_{CGRV}$ is provided. Voltage summing is used instead of current summing, and unlike current summing it does not introduce additional temperature dependencies. Furthermore, no current mirroring is used that causes inaccuracy in setting $V_{CGRV}$. Also, a positive or negative or zero Tco can be obtained.

In another aspect, the present invention provides a method and system for trimming $T_{CO}$ at a constant temperature. Temperature characterization of the flash memory device can be done efficiently without use of costly temperature chambers.

Although the present invention has been described with reference to specific embodiments, these embodiments are illustrative only and not limiting. Many other applications and embodiments of the present invention will be apparent in light of this disclosure and the following claims.

What is claimed is:

1. A system for controlling a voltage level and temperature co-efficient for read and/or program-verify voltages in a non-volatile memory device having a plurality of programmable memory cells, comprising:
   a temperature-dependent voltage generator for generating an output that is controlled independently by a first multiplier
   a temperature-independent voltage generator having a constant output, wherein the constant output is controlled by a second multiplier; and
   an amplifier that receives the constant output of the temperature-independent voltage generator and the output of temperature-dependent voltage generator to generate a voltage that is applied to a memory cell for a read, and a program-verify operation; wherein the voltage and its temperature co-efficient applied to memory cells is controlled independently so that intrinsic temperature coefficient of the memory cell is substantially similar to temperature coefficient of the applied voltage.

2. The system of claim 1, wherein a band-gap reference voltage generator provides a temperature independent output that is multiplied by the second multiplier.

3. The system of claim 1, wherein the first multiplier and the second multiplier are based on resistor ratios with resistors having similar temperature characteristics.

4. The system of claim 1, wherein the temperature coefficients can be set to negative, zero and positive values.

5. A testing system for trimming temperature co-efficient of a plurality of read and program verify voltages applied to a plurality programmable memory cells of a non-volatile memory device, comprising:
   a testing module that provides a first multiplier value for a temperature dependant voltage and a second multiplier value for a temperature independent voltage, wherein multiplied temperature dependant voltage and temperature independent voltage are added and an output voltage is generated; and
   a voltage comparator that compares the output voltage with a test voltage that is set by the testing module and generates a compare result for the testing module.

6. The testing system of claim 5, wherein the voltage comparator indicates if a testing criterion is met.

7. The testing system of claim 5, wherein the second multiplier is initially set to zero and then adjusted until a desirable output condition is achieved.

8. The testing system of claim 5, wherein the first multiplier value is adjusted until a desired temperature coefficient value is achieved.

9. The testing system of claim 5, wherein adjusted first multiplier values and second multiplier values are stored by the memory device such that a controller can use those values to control voltage and temperature coefficient values.

10. The testing system of claim 5, wherein trimming is performed at a constant temperature.

11. A method for trimming temperature co-efficient of a plurality of read voltages and program verify voltages applied to a plurality programmable memory cells of a non-volatile memory device, comprising:

applying predetermined voltage levels to an input of a voltage comparator that compares a temperature independent voltage component with a voltage set by a testing system; and compares a temperature dependent voltage component with a voltage set by the testing system;

adjusting a second voltage multiplier of the temperature-independent voltage component of a voltage that is applied to a memory cell of a non-volatile memory device until a desirable output condition is achieved;

adjusting a first voltage multiplier of the temperature-dependent component of a voltage that is applied to a memory cell of a non-volatile memory device until a desirable output condition is achieved; and storing adjusted first voltage multiplier values and adjusted second multiplier values in the memory device for use by a controller.

12. The method of claim 11, wherein the voltage comparator indicates if a testing criterion is met.

13. The method of claim 11, wherein the first multiplier is initially set to zero and then adjusted until a desirable output condition is achieved.

14. The method of claim 11, wherein the controller can use stored values to independently control voltage and temperature coefficient values.

15. The method of claim 11, wherein trimming is performed at constant temperature.

* * * * *